United States Patent [19]

Yumoto

[11] Patent Number: 5,015,519

[45] Date of Patent: * May 14, 1991

[54] MOLDED ARTICLE WITH PARTIAL METAL PLATING AND A PROCESS FOR PRODUCING SUCH ARTICLE

[75] Inventor: Tetsuo Yumoto, Tokorozawa, Japan

[73] Assignee: Sankyo Kasei Kabushiki Kaisha, Tokyo, Japan

[*] Notice: The portion of the term of this patent subsequent to Mar. 14, 2006 has been disclaimed.

[21] Appl. No.: 422,174

[22] Filed: Oct. 16, 1989

Related U.S. Application Data

[63] Continuation-in-part of Ser. No. 180,923, Apr. 13, 1988, Pat. No. 4,908,259, Continuation-in-part of Ser. No. 109,353, Oct. 15, 1987, Pat. No. 4,812,275.

[30] Foreign Application Priority Data

Nov. 18, 1986 [JP] Japan .............................. 61-273035

[51] Int. Cl.$^5$ .............................................. B32B 9/00
[52] U.S. Cl. ................................... 428/209; 428/409; 428/419; 428/457; 428/458; 428/474.4; 428/474.7; 428/704; 428/901; 427/96; 264/104; 264/129; 361/397; 174/250
[58] Field of Search ........ 428/209, 409, 419, 457–458, 428/474.4, 474.7, 704, 901; 427/96; 264/104, 129; 361/397; 174/61.5

[56] References Cited

U.S. PATENT DOCUMENTS

| | | | |
|---|---|---|---|
| 3,259,559 | 7/1966 | Schneble, Jr. et al. | 204/38 |
| 3,737,339 | 6/1973 | Alsberg et al. | 117/212 |
| 3,884,704 | 5/1975 | Rantell et al. | 106/1 |
| 4,389,771 | 6/1983 | Cassidy et al. | 29/846 |
| 4,451,505 | 5/1984 | Jans | 427/98 |
| 4,574,031 | 3/1986 | Dorey, II et al. | 156/655 |
| 4,615,763 | 10/1986 | Gelorme et al. | 156/643 |
| 4,812,275 | 3/1989 | Yumoto | 264/129 |
| 4,908,259 | 3/1990 | Yumoto | 428/209 |

FOREIGN PATENT DOCUMENTS 0192233 8/1986 European Pat. Off. .
0071272 6/1978 Japan .
0217695 10/1985 Japan .

Primary Examiner—Patrick J. Ryan
Attorney, Agent, or Firm—Jordan and Hamburg

[57] ABSTRACT

This invention relates to a partially plated molded article and to a process for the production of a molded article which is partially plated with metal such as circuit boards, connectors, decorative articles, etc., where a catalyst such as palladium, gold, etc. is added after roughening of the surface of a primary molded article, and then, the molded article is inserted into the mold and a secondary article molded thereabout so that the portions to be plated with metal are exposed, and after such molding, the exposed portions are plated with metal. Alternatively, the catalyst may be applied after molding of the secondary article around the roughened primary molded article.

14 Claims, 4 Drawing Sheets

MOLDED ARTICLE WITH PARTIAL METAL PLATING AND A PROCESS FOR PRODUCING SUCH ARTICLE

This is a continuation-in-part application of U.S. Ser. No. 180,923, filed Apr. 13, 1988, now U.S. Pat. No. 4,908,259, which in turn is a continuation-in-part application of U.S. Ser. No. 109,353, filled Oct. 15, 1987, now U.S. Pat. No. 4,812,275.

BACKGROUND OF THE INVENTION

The present invention relates to a molded article with partial metal plating and to a process for the production of such molded article such as a circuit board, connector, etc.

A process for the production of molded articles having partial plating has been disclosed in Japanese Patent Application laying-open No. 61-239694 which has been filed on the basis of U.S. patent application Ser. No. 704,440. This Japanese application specifies several production processes of which two processes will now be explained.

The first process for production includes a molding process of the molded articles, an adhesion promotion process and an adherent metal plating process.

In the molding process of the molded article, an alternate two shot injection molding is used. In the first shot, the first portion of the molded article equipped with a circuit pattern is molded using a first electrically insulating material, while in the second shot, the supporting structure is formed around the circuit pattern using a second electrically insulating material. Polyethersulfone with catalyst is used as the first electrically insulating material for forming the molded article, and the appropriate catalyst for filler material is palladium catalyst scattered on powdered aluminium silicate. The catalyst mixed in the electrically insulating material is catalytic for the material for electroless metal plating to be conducted in the adhesive metal plating. The desirable second electrically insulating material to be selected for the supporting structure is polyethersulfone (without a catalyst).

In the adhesion promotion process, the surfaces of the molded article are made micro porous and hydrophilic and the catalyst on the surface part of the circuit pattern and hole walls are exposed. Accordingly, all the flat, smooth and glittering surfaces of the molded article are matted. Further, in the metal plating process, the molded article is passed through the vapor of dichloromethane, and the matted hydrophilic surfaces of the support structure will be made flat, smooth and hydrophobic so that they can endure the metal plating from outside and once again will be returned to the metal plating solution. The reason why these kinds of processes are required is to avoid non-uniform dispersal of the palladium catalyst, and avoid having the surface layers of the circuit pattern from becoming rich with the resin portion such that the catalytic function of the surfaces are not brought into full play.

In the second production process the molded articles are formed by a two shot process, where not only the first electrically insulating material to be used in the first shot process for forming the circuit pattern, but also the second electrically insulating material to be used in the second shot molding process for molding the support structure are selected from a material having no catalyst. The molded articles are treated with etching solution for adhesion promotion, then catalyst for metal plating is added and further is activated for electroless metal plating, and then non-adhesive catalyst is washed away from the support structure, and finally the circuit pattern is subjected to copper plating using a solution for electroless copper plating.

Both processes mentioned above involve the following problems.

The first problem in the production process of the former case is that palladium catalyst is mixed into the first electrically insulating material for forming the circuit pattern. Palladium is an expensive precious metal. It needs to be mixed in a large quantity in order to cause it to conduct as a catalytic function for electroless metal plating, and accordingly, economical production is difficult. The second problem is that the former case makes the production process complicated and deteriorates the working efficiency, since a process for making the matted surfaces flat and smooth is needed in the metal plating process in addition to the need of the process to make a mat on all the smooth surfaces of the articles in order to expose the catalyst.

The problem in the production process of the latter case is that it requires work to wash away with spray the catalyst adhered to the portions other than the circuit pattern, that is to say, all the surfaces of the support structure, after activation of the molded articles but before electroless copper plating. It is time-consuming to ensure the removal of the catalyst. Especially, the work to wash away the catalyst adhering to the surface of the border portion of the circuit pattern and support structure takes a great deal of time, labor, and expense and is practically difficult. When the removal of the catalyst is incomplete in the molded articles, for instance, in the circuit boards, portions other than the circuit portions will be sure to get metal plated, and the insulation of these portions is not secured. Therefore, they will not function as circuit boards.

SUMMARY OF THE INVENTION

The present invention relates to a first process of molding a primary molded article, conducting a pretreatment of the primary molded article by adding a catalyst such as palladium, gold, silver, platinum, etc. after roughening of the surfaces of the primary molded article, forming a secondary molded article using plastic material and a mold on the base of the pre-treated primary molded article where portions of the primary molded article to be plated with metal are exposed, and plating the secondary molded article with metal.

The present invention also relates to a second process of molding a primary molded article having an outer surface and protrusions extending from the outer surface, roughening the outer surface and protrusions of the primary molded article, not adding a catalyst to the outer surfaces and protrusions of the primary molded article after roughening, molding a secondary molded article having an outer surface about the non-catalytically-treated primary molded article such that surfaces of the protrusions are exposed, treating the outer surface of the secondary molded article and exposed protrusion surfaces of the primary molded article with a catalyst such as palladium, gold, silver, platinum, etc., washing the outer surface of the secondary molded article to remove the catalyst from the outer surface of the secondary molded article but not from the exposed protrusion surfaces of the primary molded article, and then plating the exposed protrusion surfaces of the primary molded article with metal.

In addition to well-known plastics such as polyamide resin, polyphenylene sulfide resin and liquid crystal resin, also well-known ceramics, etc. can be used as raw material for forming the primary and the secondary molded articles in both processes of the present invention. The plastics material includes not only single plastics material, but also those mixed with well-known fillers such as glass fiber, potassium titanate fiber, and so on. The catalyst treatment mentioned above can be done using conventionally known processes. When the surfaces of the primary molded article in the first process above and the secondary molded article in the second process above are soiled with mold removing agent or fatty substance after forming of the primary or secondary molded article, it is advisable to remove the fat. Depending on the kind of plastic, for instance in the case of the molded article being comPosed of polyamide resin, the fat can be removed by means of such organic solvents as methylethyl ketone, acetone, surface active agent, etc. Meantime, a variety of etching solutions are used in the catalyst treatment process in order to improve the adhesion power of the plated metal. In the case of an article made of polyphenylene sulphide resin, such etching solutions as chromic acid/sulfuric acid, acidic ammonium fluoride/nitric acid and hydrofluoric acid/nitric acid are suitable.

When the molded article is made of plastic material, the manner of adding the catalyst can be selected as a practical matter from a catalyst→accelerator method and a sensitizing→activating method. The former is a method for separating palladium on the surface of the molded article by activating with an acid such as hydrochloric acid, sulfuric acid, etc. after submerging or dipping in a mixed catalytic solution of the family of tin and palladium. The latter is the method where, at first, a relatively strong reducing agent such as tin chloride, hypophosphorous acid, hydrazinium chloride, etc. is adsorbed on the surfaces of the molded article, and then the article is submerged or dipped in a catalytic solution that contains ions of precious metal such as gold and palladium and finally the precious metal is separated onto the surfaces of the molded article. It is usual for chemical copper plating or chemical nickel plating to be used for the metal plating process of the secondary molded article 2. However, if the molded article is a wiring board, the desirable process will be copper plating.

An object of this invention is thus to provide an efficient and economical mass production process for partially metal plated, molded articles which can function as circuit boards, connectors, etc., and which can also function as decorative articles.

Another object of this invention is to achieve plating with a minimal quantity of precious metal by applying the catalyst only to the surfaces of the primary molded articles or the secondary molded article.

A further object of this invention is to eliminate the necessity for washing away the catalyst and to improve production efficiency by using a mold for forming the secondary molded article where portions of the primary molded article bestowed with catalyst and to be metal plated are exposed. Alternatively, it is an object of the present invention to provide a process facilitating an efficient recovery and reuse of catalyst.

Another object of this invention is to make it possible to secure the complete insulation of portions other than the circuit portions in cases where the molded article is, for instance, a circuit board.

Another object of the present invention is to provide a plastic molded article with a strong bond between a primary molded article and a secondary molded article while avoiding creating a gap between them even after a change of thermal environment, thus eliminating entry therebetween of metal plating electrolyte during the plating process, for example, or of cleaning liquid during the cleaning process, and avoiding aging problems resulting from the plating electrolyte or cleaning liquid entering any such potential gap, which otherwise reversely flows out while corroding the plated metal, or permitting moisture to enter such potential gap and deteriorating the quality of the product.

Another object of the present invention is to expand the application of the plastic molded product, the molded article not only having a decoration application such as a button but also being functional as a plastic molded article, such as printed circuit boards and connectors, while reducing manufacturing costs and improving the quality thereof.

BRIEF DESCRIPTION OF THE DRAWINGS

The special features of this invention will be more fully explained in conjunction with the accompanying drawings, in which.

DESCRIPTION OF THE PREFERRED EMBODIMENTS

Example 1

Primary Molding Process

Figure 1:
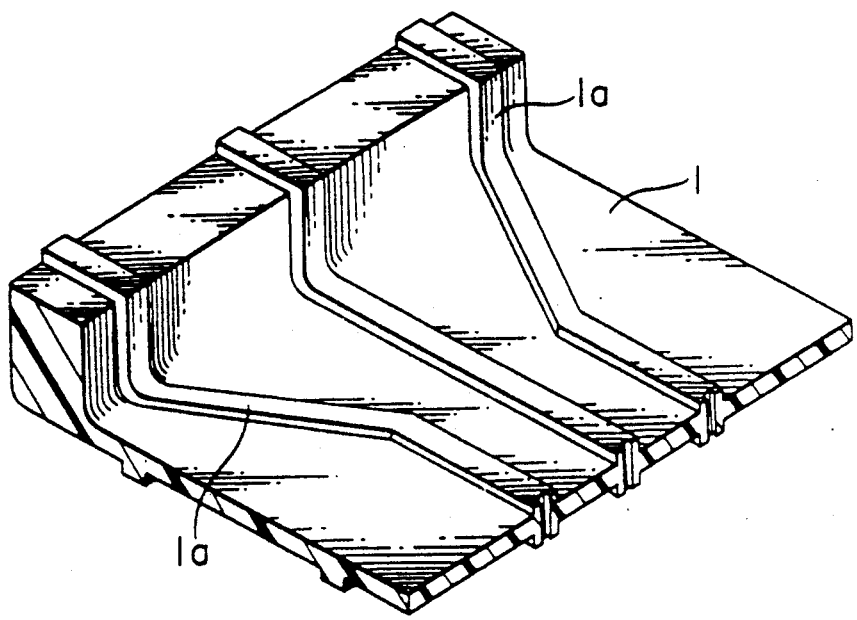
FIG. 1 is a perspective view of a circuit board as a primary molded article.

Board 1 as shown in FIG. 1 was molded as a primary molded article using a mold. A protruding pattern 1a was formed on the board.

Etching was conducted by submerging or dipping the board 1 for 5 minutes in an etching solution composed of acidic ammonium fluoride/nitric acid, at a temperature of about 40° C., after subjecting the board 1 to a fat removing treatment.

After washing the board with water, sensitizing with tin chloride and activation with palladium chloride were carried out. The board was thereafter dried.

Secondary Molding Process

Figure 2:
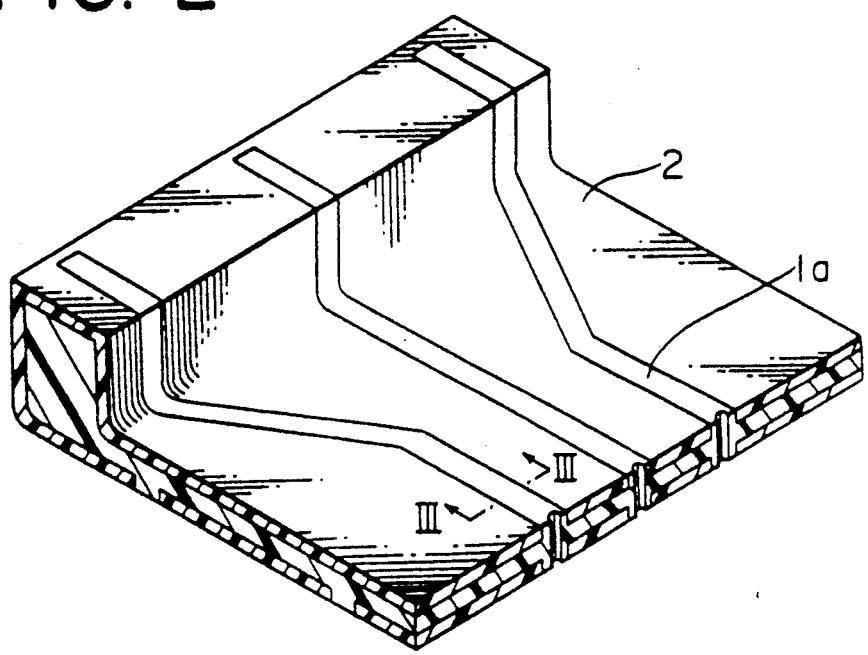
FIG. 2 is a perspective view of a circuit board as a secondary molded article.
Figure 3:
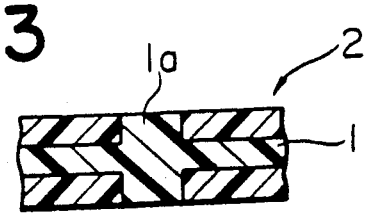
FIG. 3 is an enlarged sectional view taken along the line III—III in FIG. 2.
Figure 4:
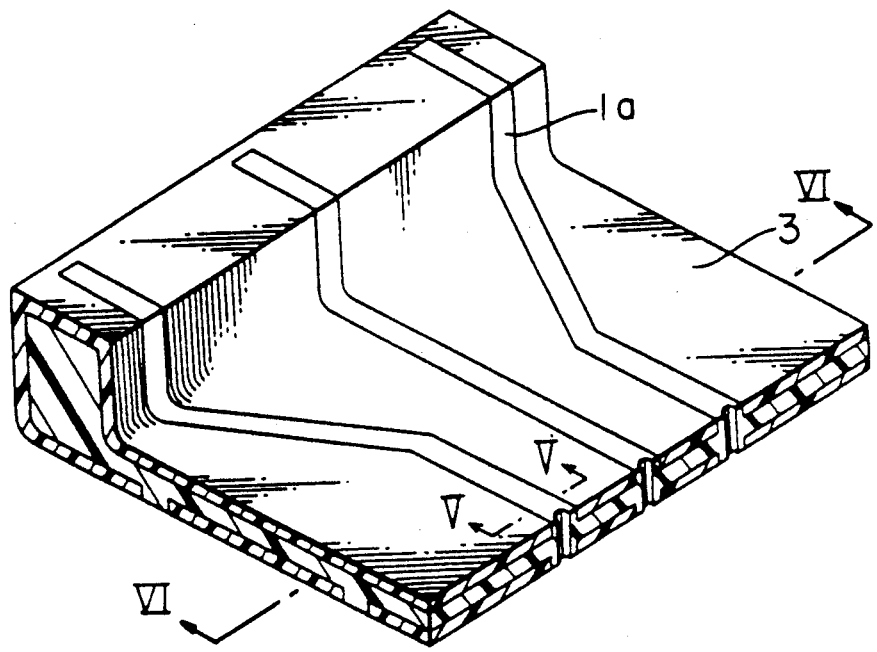
FIG. 4 is a perspective view of a circuit board as a product having partial metal plating.
Figure 5:
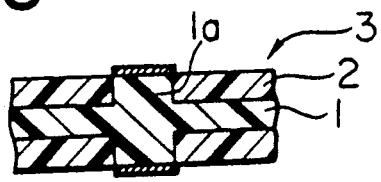
FIG. 5 is an enlarged sectional view taken along the line V—V in FIG. 4.
Figure 6:
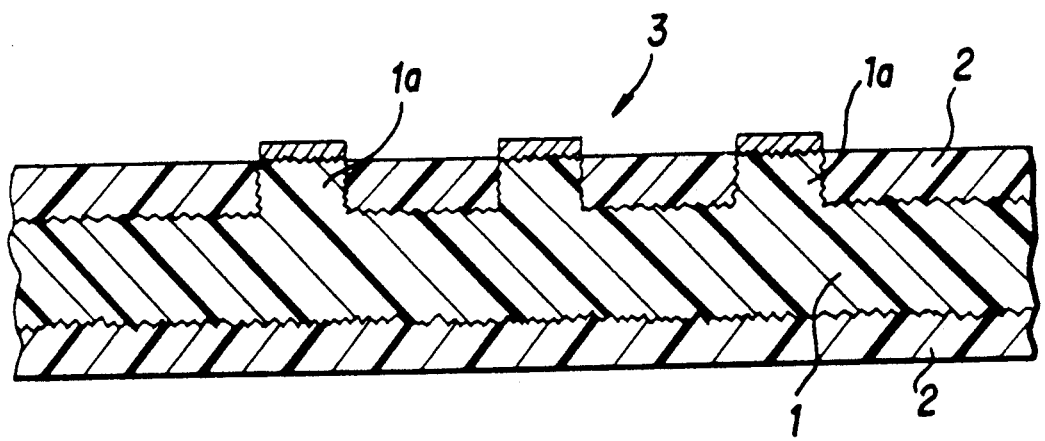
FIG. 6 is another sectional view yet further enlarged taken along the line VI—VI in FIG. 4.

After drying, the board 1 was inserted into the cavity of the mold, then the cavity was filled with liquid plastic resin and the board 2 as the secondary molded article was formed as shown in FIG. 2. As shown in FIG. 3, the pattern 1a of the board 1 protrudes outwards in the board 2. After the board 2 was subjected to a fat removing treatment, electroless metal plating was conducted to a thickness of 20 μm. By doing so, the circuit board 3 was obtained as a molded plastic article, where only the pattern 1a of the outer surface of the board was plated with metal as shown in FIG. 4 and FIG. 5.

In both the primary and secondary molding processes, a thermoplastic resin mixture composed of 60 weight % of polyphenylene sulphide resin, 35 weight % of glass fibre and 5 weight % of potassium titrate fibre (Timos D made by Otsuka Chemical) was used as raw material for the circuit board.

Example 2

A circuit board 3 was produced in the same way as in Example 1. However, as raw material for the circuit board, a thermoplastic resin mixture composed of 70% of polyethersulphone resin and 30% of glass fibre was used.

Measurement of the adhesion state of the metal plated circuit pattern of each of Examples 1 and 2 proved that the adhering strength was strongest in the case of Example 1.

A molded article of this invention comprises a plastic primary molded article 1 whose entire surface is roughened, a plastic secondary molded product 2 which is joined integratedly with the plastic primary molded article in such a manner that only the particular part 1a of the primary molded product is exposed and metal-plated.

Although the raw material used for the primary molded article is a material suitable for plating metal, the secondary molding is processable even with the same type of plastic material without the need to select a special secondary molding material, e.g., material not easily metal-plated. Consequently, there is a great deal of freedom in selecting the plastic material for molding. Even if the thermal environment may change for the plastic molded article, gaps will not be easily created between the primary and the secondary molded articles.

Also, because the entire surface of the primary molded article is roughened, the same type of plastic is selectable to mold thereon, resulting in higher adhesion between the primary and secondary molded articles. Therefore, the durability of the molded article can be improved because plating electrolyte, moisture, etc. will not enter between the primary and secondary molded articles.

Example 3

Figure 7:
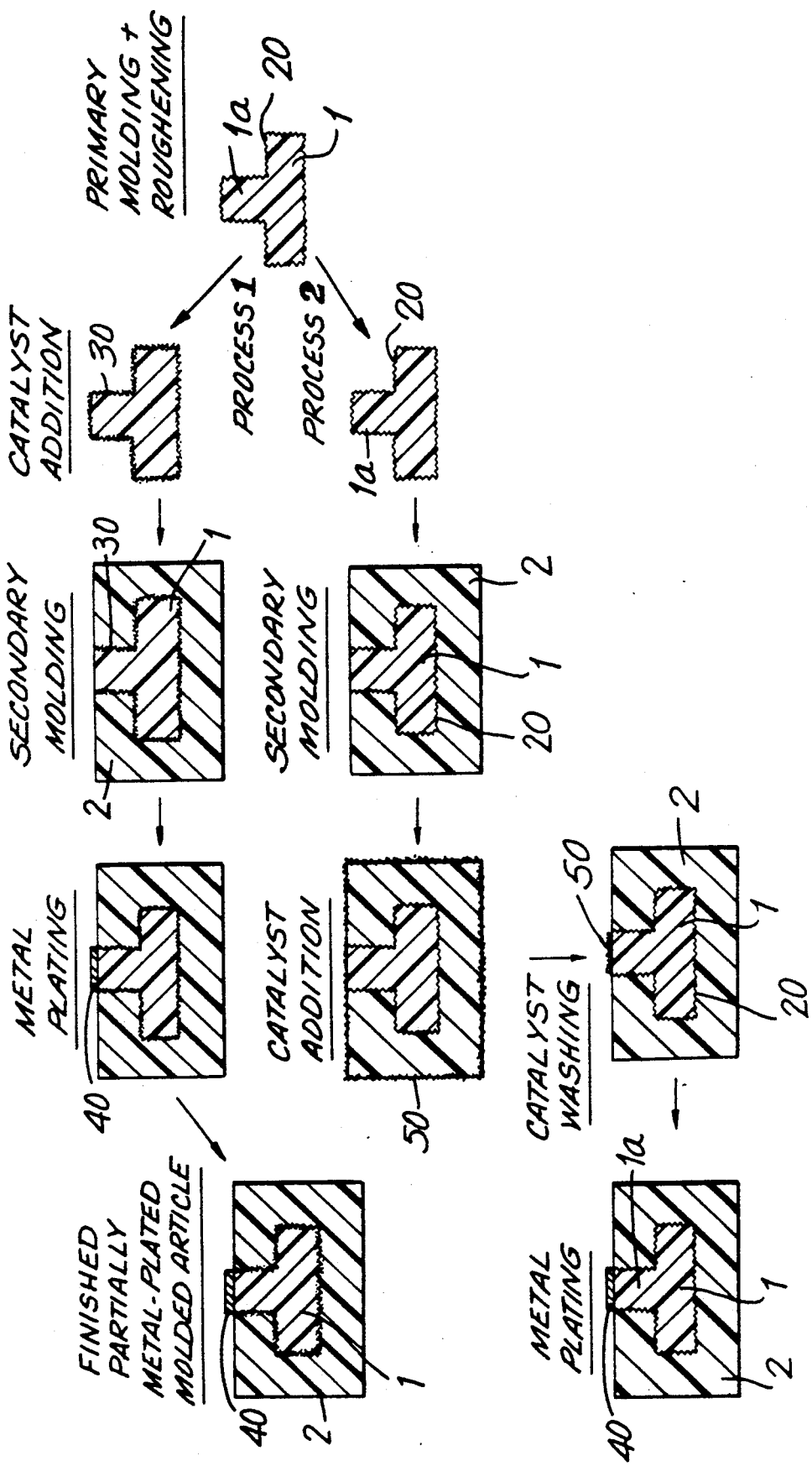
FIG. 7 is a schematic view illustrating and comparing the first and second processes of the present invention described above.

The process of the present invention as described above will now be compared with an alternative embodiment of the present invention with reference to FIG. 7.

As shown in FIG. 7, and as already described, a primary article 1 is molded with protrusions 1b, and the surface thereof roughened at 20, after which the primary molded article 1 is treated with a catalyst 30. A secondary article 2 is then molded about primary molded article 1, with protrusions 1a exposed, and the protrusions 1a are then metal-plated at 40.

In an alternative process of the present invention, a primary article 1 is molded with protrusions 1b, the surface thereof roughened at 20, and a secondary article 2 is then molded about primary molded article 1, with protrusions 1a exposed, before any catalyst treatment. Catalyst 50 is then applied, by the methods already described, about the outer surfaces of secondary molded article 2 and the exposed surfaces of protrusions 1a. The outer surfaces of secondary molded article 2 are then washed with water to remove the catalyst. Catalyst 50 is removed from the entire surface of secondary molded article 2 by the washing, but catalyst 50 is not removed from the exposed surface of protrusions 1a. This is because since the exposed surface of protrusions 1a have been roughened, catalyst 50 is tightly adhered on the roughened surface. As a result, even after washing with water, the catalyst is not removed from the exposed surface of protrusions. Conversely, since the surfaces of secondary molded article 1 are not roughened, but smooth, the catalyst is readily removed from the surfaces of secondary molded article by the water-washing step.

After washing, catalyst 50 is thus adhered only to the exposed surface of protrusion 1a. The protrusion 1a is then metal-plated to finish the partially metal-plated molded product.

This alternative process further improves the obtained product in comparison to conventional molded products. Specifically, when catalyst is disposed on the entire surface of the primary molded article and then the secondary article is molded thereabout, catalyst is trapped between the primary and secondary molded articles. This trapped catalyst may degrade over time if it is highly concentrated, thus adversely affecting the bond between the primary and secondary molded articles. The alternative process described above eliminates this potential drawback. Since catalyst is not applied at the interface between the primary and secondary molded articles, the bond therebetween is very strong due to the roughened surface of the primary molded article and the potentially deleterious effect of catalyst disposed therebetween is eliminated.

Moreover, in this alternative process of the present invention, there is an optimim use of expensive catalyst. Catalyst washed from the surface of the secondary molded article can be recovered and reused.

The method of the invention is applicable to three-dimensional shapes, and is not limited only to plate shapes (two-dimensional form). Thus, the method is also applicable to products other than printed circuit boards and electronic parts. In addition, even where a filler such as glass fiber is mixed in the molding material in order to improve the heat resistance or strength, a product having partial plating can be manufactured at low cost and high yield with or without the filler.

What I claim is:

1. A partially metal-plated molded product comprising a plastic primary molded article having an outer surface, protrusions extending from said outer surface of said primary molded article, roughening means on said outer surface and on said protrusions of said primary molded article, a plastic secondary molded article disposed about said primary molded article, said secondary molded article having an external surface with through openings in which are disposed said protrusions of said primary molded article, said protrusions having exposed external faces, a catalyst disposed on the exposed external faces of said protrusions but not on the outer surface of said primary molded article, and plated metal on the catalyst disposed on said exposed external faces of said protrusions.

2. A partially metal-plated molded product according to claim 1 wherein said catalyst is selected from the group consisting of palladium, gold, silver and platinum.

3. A partially metal-plated molded product according to claim 1 wherein said plastics of said primary and secondary molded articles are selected from the group consisting of polyamide, polyphenlene sulphide, polyethersulfone, and liquid crystal resin.

4. A partially metal-plated molded product according to claim 3 wherein said plastics further comprise a filler selected from the group consisting of glass fiber and potassium titanate fibers.

5. A partially metal-plated molded product according to claim 1 wherein said exposed external surfaces of said protrusions are planar with said external surface of said secondary molded article.

6. A process for producing a partially metal-plated molded product comprising the steps of molding a plastic primary molded article having an outer surface and at least one protrusion extending from said outer surface without using a catalyst, chemically roughening the outer surface and protrusions of said primary molded article, molding a plastic secondary molded article having an outer surface about said primary molded article such that outer surfaces of said protrusions are exposed, treating the outer surface of said secondary molded article and the exposed outer surfaces of said protrusions with a catalyst, washing the outer surface of said secondary molded article to remove said catalyst from said outer surface of said secondary molded article without removing catalyst from the exposed outer surfaces of said protrusions, and then plating the exposed outer surfaces of said protrusions with a metal.

7. A process for producing a partially metal-plated molded product according to claim 6 wherein said step of roughening the surface of said primary molded article comprises submerging or dipping said primary molded article in an acid etching solution.

8. A process for producing a partially metal-plated molded product according to claim 7 wherein said acid etching solution is selected from the group consisting of chromic acid/sulfuric acid, acidic ammonium fluoride/nitric acid, and hydrofluoric acid/nitric acid.

9. A process for producing a partially metal-plated molded product according to claim 6 wherein said catalyst is selected from the group consisting of palladium, gold, silver and platinum.

10. A process for producing a partially metal-plated molded product according to claim 6 wherein said plastics of said primary and secondary molded articles are selected from the group consisting of polyamide, polyphenylene sulphide, polyethersulfone, and liquid crystal resin.

11. A process for providing a partially metal-plated molded product according to claim 10 wherein said plastics further comprise a filler selected from the group consisting of glass fiber and potassium titanate fibers.

12. A process for producing a partially metal-plated product according to claim 6 wherein said primary molded article is molded in a first mold without a catalyst and said secondary molded article is molded in a second mold.

13. A process for producing a partially metal-plated molded product according to claim 6 wherein said outer surface of said secondary molded article is washed with water.

14. A partially metal-plated molded product made according to the process of claim 6.

* * * * *